(12) United States Patent
Balasubramanian et al.

(10) Patent No.: US 11,511,889 B1
(45) Date of Patent: Nov. 29, 2022

(54) INLINE SENSOR ASSEMBLY TO MONITOR AIR DATA PROBE HEATER

(71) Applicant: Rosemount Aerospace Inc., Burnsville, MN (US)

(72) Inventors: Rameshkumar Balasubramanian, Apple Valley, MN (US); Cal Roeske, Eagan, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 171 days.

(21) Appl. No.: 16/949,110

(22) Filed: Oct. 14, 2020

(51) Int. Cl.
- *B64F 5/60* (2017.01)
- *G01R 31/28* (2006.01)
- *H05B 3/00* (2006.01)
- *G01P 13/02* (2006.01)

(52) U.S. Cl.
CPC ............ *B64F 5/60* (2017.01); *G01R 31/2829* (2013.01); *H05B 3/0023* (2013.01); *G01P 13/025* (2013.01); *H05B 2203/014* (2013.01); *H05B 2214/02* (2013.01)

(58) Field of Classification Search
CPC ..... B64F 5/60; G01R 31/2829; H05B 3/0023; H05B 2203/014; H05B 2214/02; G01P 13/025
USPC ....................................................... 324/242
See application file for complete search history.

(56) References Cited

U.S. PATENT DOCUMENTS

| | | | |
|---|---|---|---|
| 5,601,254 | A | 2/1997 | Ortiz et al. |
| 9,927,480 | B2 | 3/2018 | Nesnidal |
| 10,197,517 | B2 | 2/2019 | Essawy et al. |
| 10,564,203 | B2 | 2/2020 | Essawy et al. |
| 2018/0275181 | A1* | 9/2018 | Essawy ............... G01R 31/008 |
| 2018/0275185 | A1 | 9/2018 | Essawy et al. |
| 2019/0037643 | A1 | 1/2019 | Dinh |
| 2019/0382139 | A1 | 12/2019 | Shi |
| 2020/0191851 | A1 | 6/2020 | Essawy et al. |

OTHER PUBLICATIONS

Extended European Search Report dated Feb. 23, 2022, received for corresponding European Application No. 21202743.7, pp. 5.

* cited by examiner

*Primary Examiner* — Farhana A Hoque
(74) *Attorney, Agent, or Firm* — Kinney & Lange, P.A.

(57) ABSTRACT

A sensor assembly for monitoring a heater system for an aircraft probe sensor includes a current sensor module with a current sensor core and a high electromagnetically permeable enclosure around the current sensor core. An input wire pathway extends through the current sensor core and is configured to receive a heater input wire. A return wire pathway extends through the current sensor core and is configured to receive a heater return wire. A high electromagnetically permeable tube extends through the current sensor core and is configured to extend around one of the input wire and the heater return wire.

19 Claims, 6 Drawing Sheets

INLINE SENSOR ASSEMBLY TO MONITOR AIR DATA PROBE HEATER

BACKGROUND

The present invention relates generally to probes, and in particular to heating systems of aircraft data probes.

Probes are utilized to determine characteristics of an environment. In aircraft systems, for example, air data probes are installed on every aircraft flying today to measure total pressure, static pressure and for some applications pressures for angle of attack and side slip. An air data function converts the pressure difference into airspeed, altitude, Mach number, flight direction, angle of attack, and angle of sideslip, among others.

The air data probes are installed on the outside of aircraft and are thus exposed to harsh and freezing weather conditions. The harsh weather conditions may cause ice formation on part of an air data probe, resulting in incorrect measurement of air data parameters. To prevent ice formation, a resistive heating element is installed in the air data probe which prevents ice formation on the air data probe. An operational voltage is provided through the heating element to provide heating for the air data probe.

Prolonged usage and frequent switching (OFF state to ON state, and vice versa) of the heating element causes the heating element in the air data probe to break down. When the heating element breaks down, the air data probe needs to be replaced prior to subsequent aircraft takeoff. Thus, monitoring the health of the heating element is very desirable.

SUMMARY

In one aspect of the disclosure, a sensor assembly for monitoring a heater system for an aircraft probe sensor includes a first current sensor module and a second current sensor module. The first current sensor module includes a first current sensor core and a first high electromagnetically permeable enclosure around the first current sensor core. A first input wire pathway extends through the first current sensor core and the first high electromagnetically permeable enclosure and is configured to receive a heater input wire. A first return wire pathway extends through the first current sensor core and the first high electromagnetically permeable enclosure and is configured to receive a heater return wire. The second current sensor module includes a second current sensor core and a second high electromagnetically permeable enclosure around the second current sensor core. A second input wire pathway extends through the second current sensor core and the second high electromagnetically permeable enclosure and is configured to receive the heater input wire. A second return wire pathway extends through the second current sensor core and the second high electromagnetically permeable enclosure and is configured to receive the heater return wire. A high electromagnetically permeable tube extends through the first current sensor core and is configured to extend around one of the heater input wire and the heater return wire.

In another aspect of the disclosure, a sensor assembly for monitoring a heater system for an aircraft probe sensor includes a current sensor module. The current sensor module includes a current sensor core and a high electromagnetically permeable enclosure around the current sensor core. An input wire pathway extends through the current sensor core and is configured to receive a heater input wire. A return wire pathway extends through the current sensor core and is configured to receive a heater return wire. A high electro-magnetically permeable tube extends through the current sensor core and is configured to extend around one of the input wire and the heater return wire.

In another aspect of the disclosure, a method for monitoring current in a heater system for an aircraft probe sensor includes feeding an input wire of the heater system through an input pathway across a first current sensor module and across a second current sensor module. A return wire of the heater system is fed through a return pathway across the first current sensor module and across the second current sensor module. A voltage is applied across the input wire and the return wire of the heater system. The first current sensor module is shielded from magnetic flux in the return wire with a high electromagnetically permeable tube extending around the return wire in the first current sensor module. Magnetic flux in the input wire is sensed by the first current sensor module to determine input current in the input wire. The second current sensor module is shielded from the magnetic flux in the input wire with a second high electromagnetically permeable tube extending around the input wire in the second current sensor module. The magnetic flux is sensed in the return wire by the second current sensor module to determine return current in the return wire.

While the above-identified drawing figures set forth one or more embodiments of the invention, other embodiments are also contemplated. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings. Like reference numerals identify similar structural elements.

DETAILED DESCRIPTION

This disclosure relates to a current sensor assembly for monitoring a heater system for an aircraft probe. An input wire and a return wire of the heater system are passed through the current sensor assembly to shorten installation time and allow retroactive installation. High electromagnetically permeable tubes are selectively positioned around the input wire and the return wire in the current sensor assembly to selectively monitor an input/main current, a return current, and a differential current of the heater system. High electromagnetically permeable enclosures are used in the current sensor assembly to protect the current sensor assembly from interference from external sources. The current sensor assembly is discussed below with reference to the figures.

Figure 1:
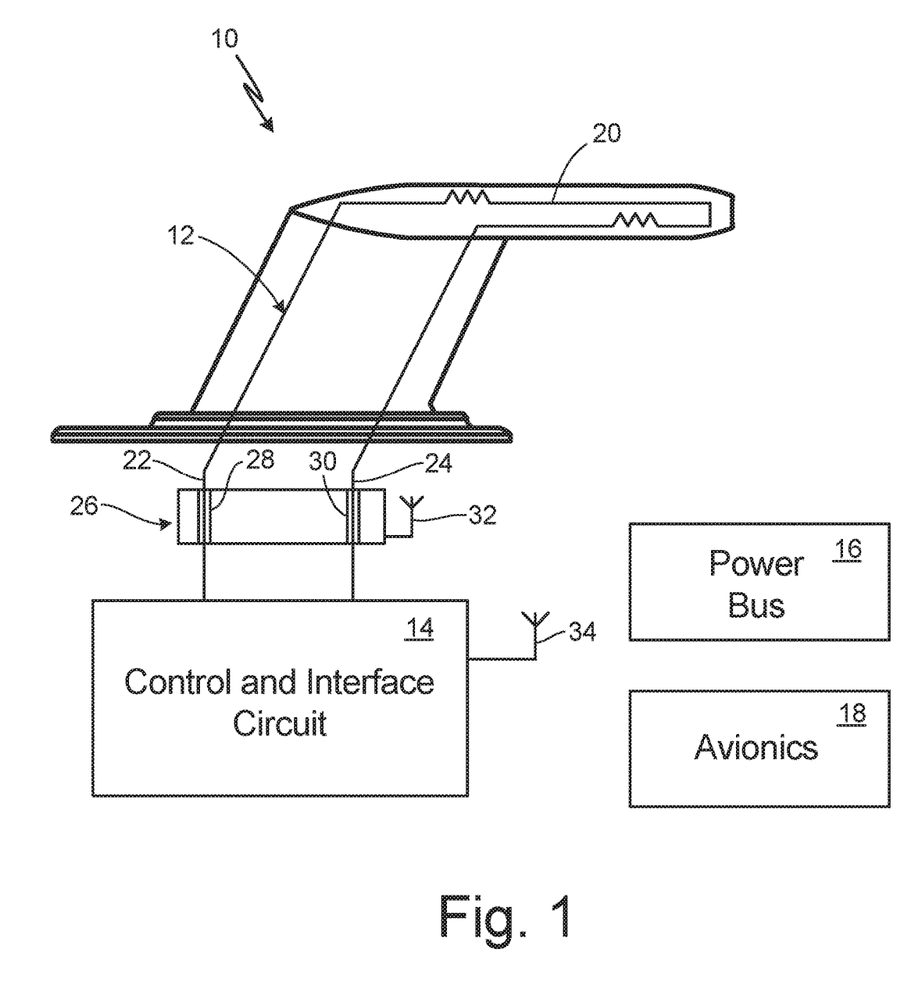
FIG. 1 is a schematic diagram of an aircraft probe that includes a heating system and a current sensor assembly.

FIG. 1 is a schematic diagram of aircraft probe 10. As shown in FIG. 1, aircraft probe 10 includes heater system 12, and control and interface circuit 14. Aircraft probe 10 is connected to power bus 16 and communicates with avionics 18. Heater system 12 includes resistive heating element 20, input wire 22, and return wire 24. Current sensor assembly 26 monitors heater system 12 and includes input wire pathway 28 and return wire pathway 30 that accommodate input wire 22 and return wire 24 of heater system 12. Current sensor assembly 26 also includes wireless transmitter 32 that transfers information to wireless receiver 34 on control and interface circuit 14 and/or avionics 18.

Aircraft probe 10 may be any type of probe such as, but not limited to, pitot probes, TAT probes, angle-of-attack (AOA) probes and any other probes that require heater system 12. Aircraft probe 10 is configured for mounting on the exterior of commercial aircraft, military aircraft, unmanned aerial vehicles, helicopters. Aircraft probe 10 can even be adapted for ground-based use and vehicles. Aircraft probe 10 is connected to receive control and power from control and interface circuit 14. Control and interface circuit 14 can be implemented local to aircraft probe 10 (e.g., implemented as a "smart probe") or remote of aircraft probe 10. Control and interface circuit 14 can include, for example, a microcontroller, programmable logic device, application integrated circuit (ASIC), or any other digital and/or analog circuitry.

Resistive heating element 20 of heater system 12 is integrated into aircraft probe 10 wherever heat is needed. In some designs, resistive heating element 20 is a heater wire that is embedded within the body of aircraft probe 10. Input wire 22 and return wire 24 are lead wires that electrically connect resistive heating element 20 to a power source. Heater system 12, for example, can receive power directly, or through control and interface circuit 14, from aircraft power bus 16 to provide heating for aircraft probe 10. Power bus 16 may be any direct current (DC) or alternating current (AC) aircraft power bus. For example, resistive heating element 20 can receive power via input wire 22 and return wire 24 from a 28 Volt DC power bus. An operational current, based on the power received from power bus 16, flows through input wire 22, across resistive heating element 20, and through return wire 24. As the operation current flows across resistive heating element 20 electrical resistance in resistive heating element 20 generates heat for aircraft probe 10. Control and interface circuit 14 may also be connected to aircraft avionics 18. Alternatively, control and interface circuit 14 may be implemented integral to aircraft avionics 18. Control and interface circuit 14 may be configured to provide data to, and receive data from, aircraft avionics 18.

Current sensor assembly 26 senses current flowing into, and out of, resistive heating element 20 at input wire 22 and return wire 24. Input wire 22 is fed completely through input wire pathway 28 and return wire 24 is fed completely through return wire pathway 30. Current sensor assembly 26 provides signals indicative of the sensed current at input wire 22 and return wire 24 to control and interface circuit 14. Wireless transmitter 32 of current sensor assembly 26 can communicate and transmit the signals to wireless receiver 34 of control and interface circuit 14 and/or avionics 18. Over time, resistive heating element 20 may degrade, and eventually break down such that current no longer flows through resistive heating element 20 to provide heating for aircraft probe 10. Current sensor assembly 26 will sense the change in current across resistive heating element 20 as resistive heating element 20 degrades and will sense the stop of current when resistive heating element 20 eventually breaks down. Current sensor assembly 26 transmits these changes in current in resistive heating element 20 to control and interface circuit 14 and/or avionics 18, which in turn send(s) an alert that aircraft probe 10 must be repaired or replaced. Current sensor assembly 26 is described below in greater detail with reference to FIGS. 2-3C.

Figure 2:
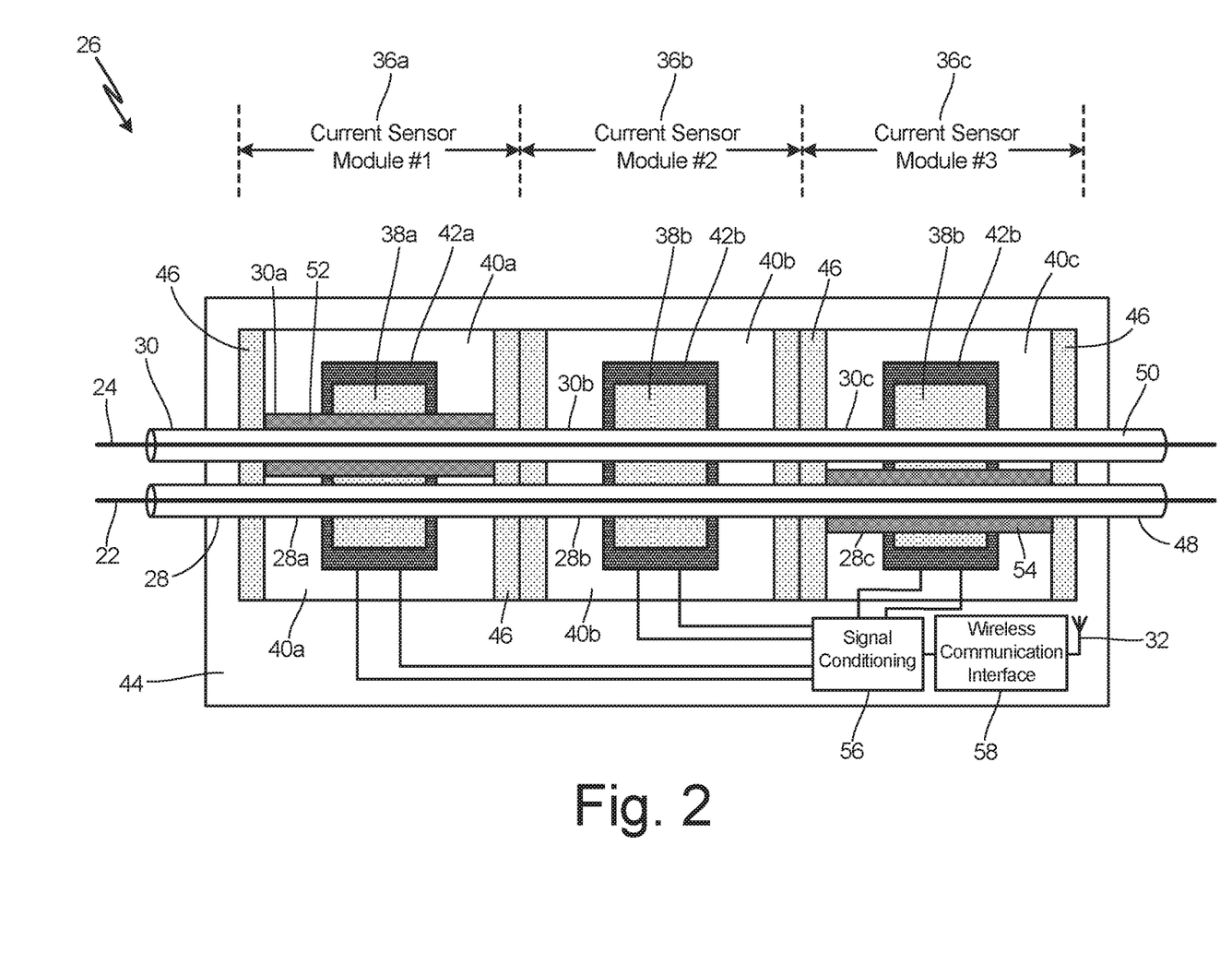
FIG. 2 is a cross-sectional view of the current sensor assembly from FIG. 1 with a first current sensor module, a second current sensor module, and a third current sensor module.
Figure 3A:
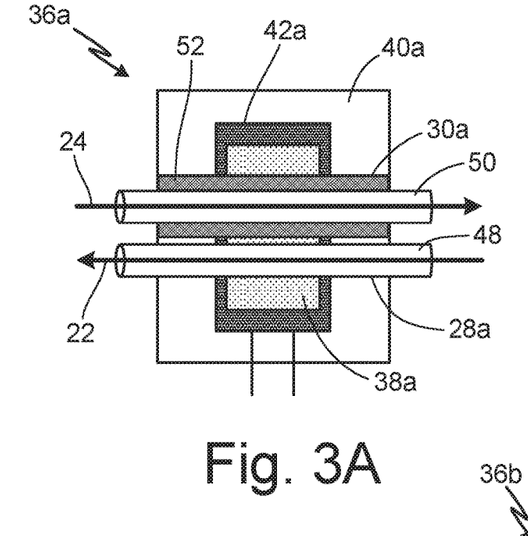
FIG. 3*a* is a cross-sectional view of the first current sensor module from FIG. 2.
Figure 3B:
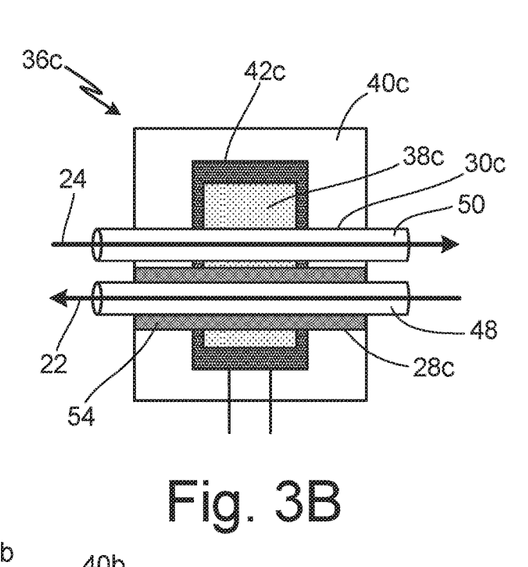
FIG. 3*b* is a cross-sectional view of the third current sensor module from FIG. 2.
Figure 3C:
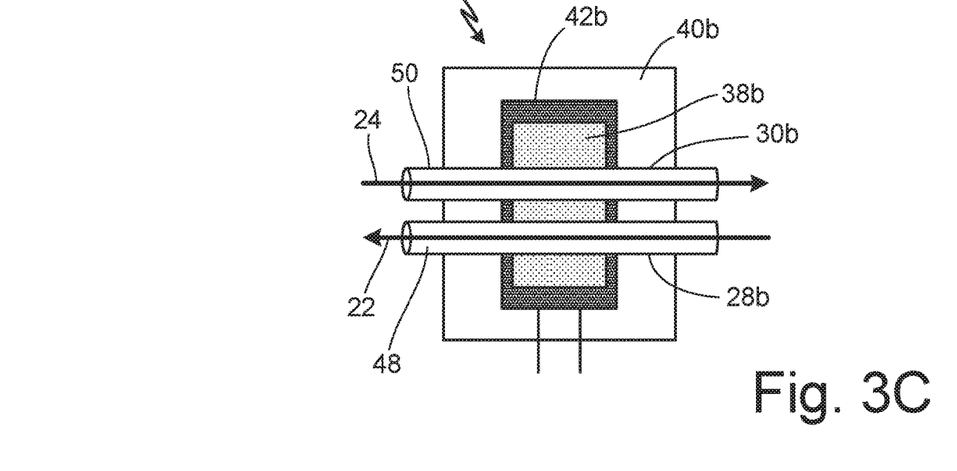
FIG. 3*c* is a cross-sectional view of the second current sensor module from FIG. 2.

FIGS. 2-3C will be discussed concurrently. FIG. 2 is a cross-sectional view of current sensor assembly 26 with first current sensor module 36a, second current sensor module 36b, and third current sensor module 36c. FIG. 3A is a cross-sectional view of first current sensor module 36a, FIG. 3B is a cross-sectional view of third current sensor module 36c, and FIG. 3C is a cross-sectional view of second current sensor module 36b. As shown in FIGS. 2-3C, first current sensor module 36a includes current sensor core 38a, enclosure 40a, and current sensor casing 42a. Second current sensor module 36b includes current sensor core 38b, enclosure 40b, and current sensor casing 42b. Third current sensor module 36c includes current sensor core 38c, enclosure 40c, and current sensor casing 42c. Current sensor assembly 26 further includes housing 44, padding 46, first guide tube 48, second guide tube 50, first high electromagnetically permeable (HEP) tube 52, second high electromagnetically permeable (HEP) tube 54, signal conditioner 56, and wireless communication interface 58. Input wire pathway 28 includes first section 28a, second section 28b, and third section 28c. Return wire pathway 30 includes first section 30a, second section 30b, and third section 30c.

First current sensor module 36a, second current sensor module 36b, and third current sensor module 36c are all contained within housing 44 of current sensor assembly 26. In other embodiments of the disclosure, first current sensor module 36a, second current sensor module 36b, and third current sensor module 36c can be positioned apart from each other in separate housings. Current sensor cores 38a, 38b, 38c can be non-contact current sensors such as, for example, a current transformer or Hall effect sensor. Current sensor cores 38a, 38b, 38c are each enclosed by current sensor casings 42a, 42b, 42c respectively for electrical insulation. Current sensor cores 38a, 38b, 38c are also enclosed by enclosures 40a, 40b, 40c respectively. Enclosures 40a, 40b, 40c are formed from a high electromagnetically permeable material to electromagnetically shield current sensor cores 38a, 38b, 38c from each other and from outside interference. A material has high electromagnetic permeability when the material has a permeability in the range of $9.42 \times 10^{-4} \mu$ (H/m) to $1.26 \times 10^{0} \mu$ (H/m) between 0.002 T to 0.5 T. Examples of high electromagnetically permeable material include but are not limited to iron, electrical steel, ferritic stainless steel, martensitic stainless steel, permalloy, metglas 2714A, mu-metal, cobalt-iron, and ferrite. Padding 46 is attached to enclosures 40a, 40b, 40c to provide damping between enclosures 40a, 40b, 40c and damping between housing 44 and enclosures 40a, 40b, 40c.

Input wire pathway 28 extends through housing 44 and each of first, second, and third current sensor modules 36a, 36b, 36c. First section 28a of input wire pathway 28 extends through padding 46, enclosure 40a, current sensor casings 42a, and current sensor core 38a of first sensor module 36a. Second section 28b of input wire pathway 28 extends through padding 46, enclosure 40b, current sensor casings 42b, and current sensor core 38b of second sensor module 36b. Third section 28c of input wire pathway 28 extends through padding 46, enclosure 40c, current sensor casings 42c, and current sensor core 38c of third sensor module 36c. First current sensor module 36a is positioned adjacent second current sensor module 36b, and third current sensor module 36c is position adjacent second current sensor module 36b such that first section 28a, second section 28b, and third section 28c of input wire pathway 28 are all aligned to form a inline pathway. In other embodiments, first, second, and third current sensor modules 36a, 36b, and 36c respectively can be spaced apart such that first section 28a, second section 28b, and third section 28c of input wire pathway 28 are not contiguous.

Return wire pathway 30 extends through housing 44 and each of first, second, and third current sensor modules 36a, 36b, 36c. First section 30a of return wire pathway 30 extends through padding 46, enclosure 40a, current sensor casings 42a, and current sensor core 38a of first sensor module 36a. Second section 30b of return wire pathway 30 extends through padding 46, enclosure 40b, current sensor casings 42b, and current sensor core 38b of second sensor module 36b. Third section 30c of return wire pathway 30 extends through padding 46, enclosure 40c, current sensor casings 42c, and current sensor core 38c of third sensor module 36c. First current sensor module 36a is positioned adjacent second current sensor module 36b, and third current sensor module 36c is position adjacent second current sensor module 36b such that first section 30a, second section 30b, and third section 30c of return wire pathway 30 are all aligned to form a inline pathway. In other embodiments, first, second, and third current sensor modules 36c can be spaced apart such that first, second, and third sections 30a, 30b, and 30c respectively of return wire pathway 30 are not contiguous.

First guide tube 48 extends in first section 28a, second section 28b, and third section 28c of input wire pathway 28 and traverses first current sensor module 36a, second current sensor module 36b, and third current sensor module 36c. First guide tube 48 is sized to receive input wire 22. Input wire 22 is inserted into first guide tube 48 and extends completely across current sensor cores 38a, 38b, 38c through first guide tube 48. Second guide tube 50 extends in first section 30a, second section 30b, and third section 30c of return wire pathway 30 and traverses first current sensor module 36a, second current sensor module 36b, and third current sensor module 36c. Second guide tube 50 is sized to receive return wire 24. Return wire 24 is inserted into second guide tube 50 and extends completely across current sensor cores 38a, 38b, 38c through second guide tube 50. First guide tube 48 and second guide tube 50 can both be flexible and include a lubricant or slippery interior surface that allows easy feeding of input wire 22 and return wire 24 through current sensor assembly 26. Current sensor assembly 26 is relatively easy and fast to install onto heater system 12. Current sensor assembly 26 can be installed onto heater system 12 by un-pinning input wire 22 and return wire 24 from control and interface circuit 14, feeding input wire 22 through first guide tube 48, feeding return wire 24 through second guide tube 50, and re-pinning input wire 22 and return wire 24 to control and interface circuit 14. Thus, current sensor assembly 26 can be retro-fitted onto existing heater systems without having to add or replace any additional wiring.

As shown in FIGS. 2 and 3A, first HEP tube 52 is positioned inside of first current sensor module 36a and is inside first section 30a of return wire pathway 30 or forms first section 30a of return wire pathway 30. First HEP tube 52 extends across current sensor core 38a and extends around second guide tube 50. When return wire 24 is fed through second guide tube 50, return wire 24 passes through first HEP tube 52. First HEP tube 52 is a seamless tube formed from a high electromagnetically permeable material to electromagnetically shield current sensor core 38a from the magnetic flux of the current in return wire 24 when a voltage is applied to heater system 12. Because of first HEP tube 52, current sensor core 38a of first current sensor module 36a does not sense current in return wire 24. Rather, current sensor core 38a of first current sensor module 36a solely senses current in input wire 22 when voltage is applied to heater system 12.

As shown in FIGS. 2 and 3B, second HEP tube 54 is positioned inside of third current sensor module 36c and is inside third section 28c of input wire pathway 28 or forms third section 28c of input wire pathway 28. Second HEP tube 54 extends across current sensor core 38c and extends around first guide tube 48. When input wire 22 is fed through first guide tube 48, input wire 22 passes through second HEP tube 54. Second HEP tube 54 is a seamless tube formed from a high electromagnetically permeable material to electromagnetically shield current sensor core 38c from the magnetic flux of the current in input wire 22 when a voltage is applied to heater system 12. Because of second HEP tube 54, current sensor core 38c of third current sensor module 36c does not sense current in input wire 22. Rather, current sensor core 38c of third current sensor module 36c solely senses current in return wire 24 when voltage is applied to heater system 12.

As shown in FIGS. 2 and 3C, second current sensor module 36b does not include any HEP tubes. Current sensor core 38b of second current sensor module 36b senses magnetic flux from both input wire 22 and current in return wire 24. Current sensor core 38b thereby monitors the differential current, which is the difference between the current in input wire 22 and the current in return wire 24. Sensing the differential current of heater system 12 can be used to determine the amount of heat being generated by resistive heating element 20. A change in differential current over time can indicate wear of resistive heating element 20 and can be used to predict when aircraft probe 10 requires repair or replacement before heating element 20 breaks down completely.

Current sensor cores 38a, 38b, 38c are each wired to signal conditioner 56 and wireless communication interface 58. Signal conditioner 56 and wireless communication interface 58 prepare the signals from current sensor cores 38a, 38b, 38c for transmission through wireless antenna 32. Wireless communication interface 58 and wireless antenna 32 can communicate the signals from current sensor cores 38a, 38b, 38c via Wi-Fi, cellular, Bluetooth, or any other suitable form of wireless communication that allows signals or data to be communicated from current sensor assembly 26 to control and interface circuit 14 and/or avionics 18. While each of first, second, and third current sensor modules 36a, 36b, 36c are described above as each including one current sensor core, first, second, and third current sensor modules 36a, 36b, 36c can each include multiple current sensor cores, as described below with reference to FIGS. 4 and 5.

Figure 4:
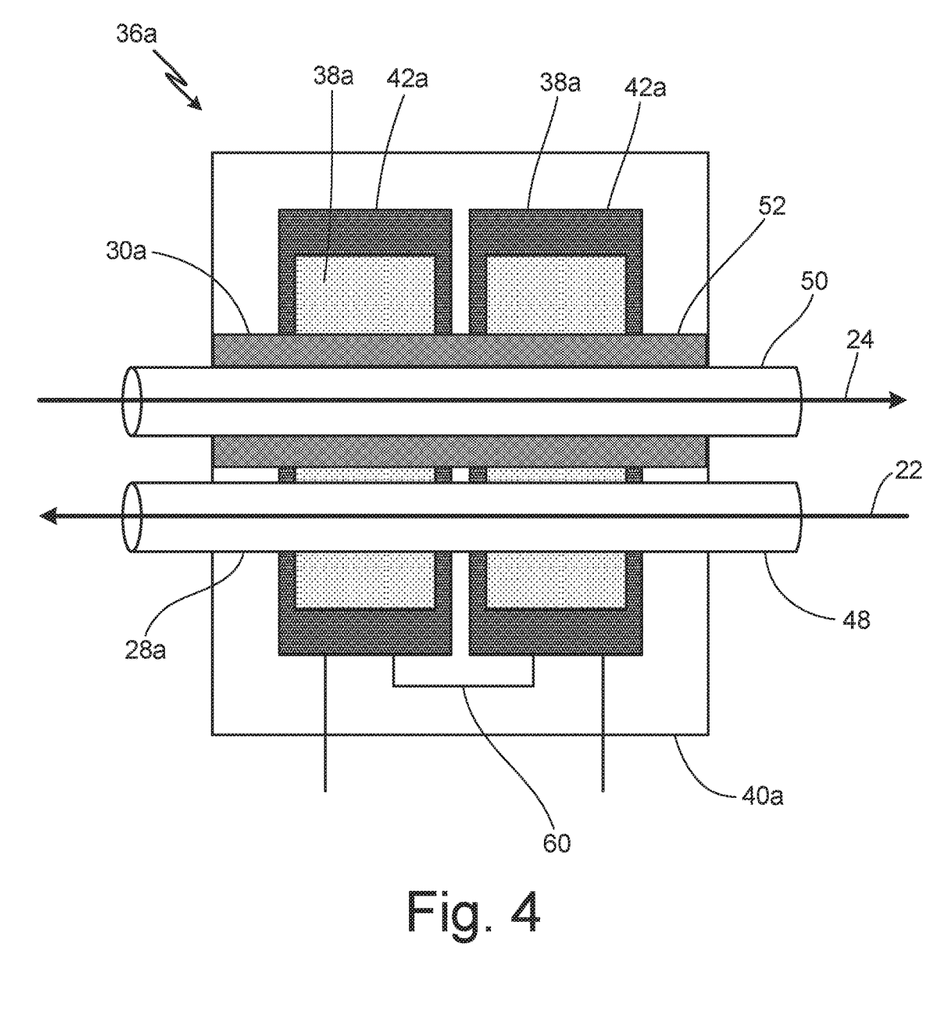
FIG. 4 is a cross-sectional view of another embodiment of the first current sensor module.

FIG. 4 is a cross-sectional view of another embodiment of first current sensor module 36a. As shown in FIG. 4, first current sensor module 36a includes two current sensor cores 38a within the same enclosure 40a. Enclosure 40a can electromagnetically shield current sensor cores 38a from each other except for daisy-chain link 60 that connects both sensor cores 38a together. Daisy chaining both current sensor cores 38a together can increase the current sensing sensitivity and capability of first sensor module 36a. In the embodiment of FIG. 4, first HEP tube 52 extends across both current sensor cores 38a and around second guide tube 50. While daisy-chain link 60 is described above with reference to first current sensor module 36a, a similar configuration and daisy-chain link can also be used on second current sensor module 36b and/or third current sensor module 36c.

Figure 5:
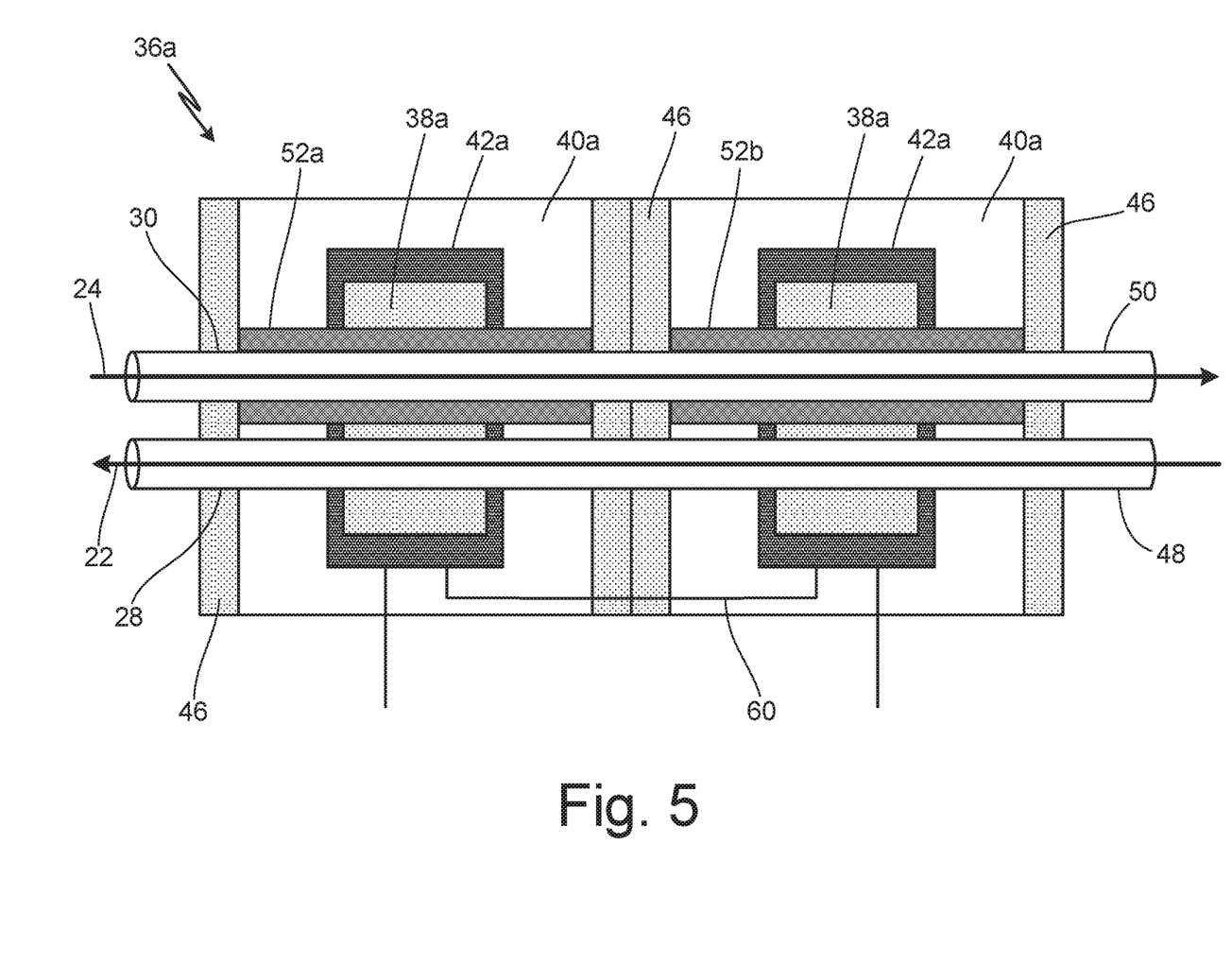
FIG. 5 is a cross-sectional view of another embodiment of the first current sensor module.

FIG. 5 is a cross-sectional view of another embodiment of first current sensor module 36a with two current sensor cores 38a linked together by daisy-chain link 60. As shown in FIG. 5, first current sensor module 36a includes two enclosures 40a each housing one of the two current sensor cores 38a. The two enclosures 40a are stacked in-line together and daisy-chain link 60 connects the two current sensor cores 38a together. Each of the two enclosures 40a includes one HEP tube 52a, 52b extending through current sensor core 38a and around second guide tube 50. While the embodiment in FIG. 5 is discussed with reference to first current sensor module 36a, similar modifications and configurations can be made to second current sensor module 36b and/or third current sensor module 36c.

Figure 6:
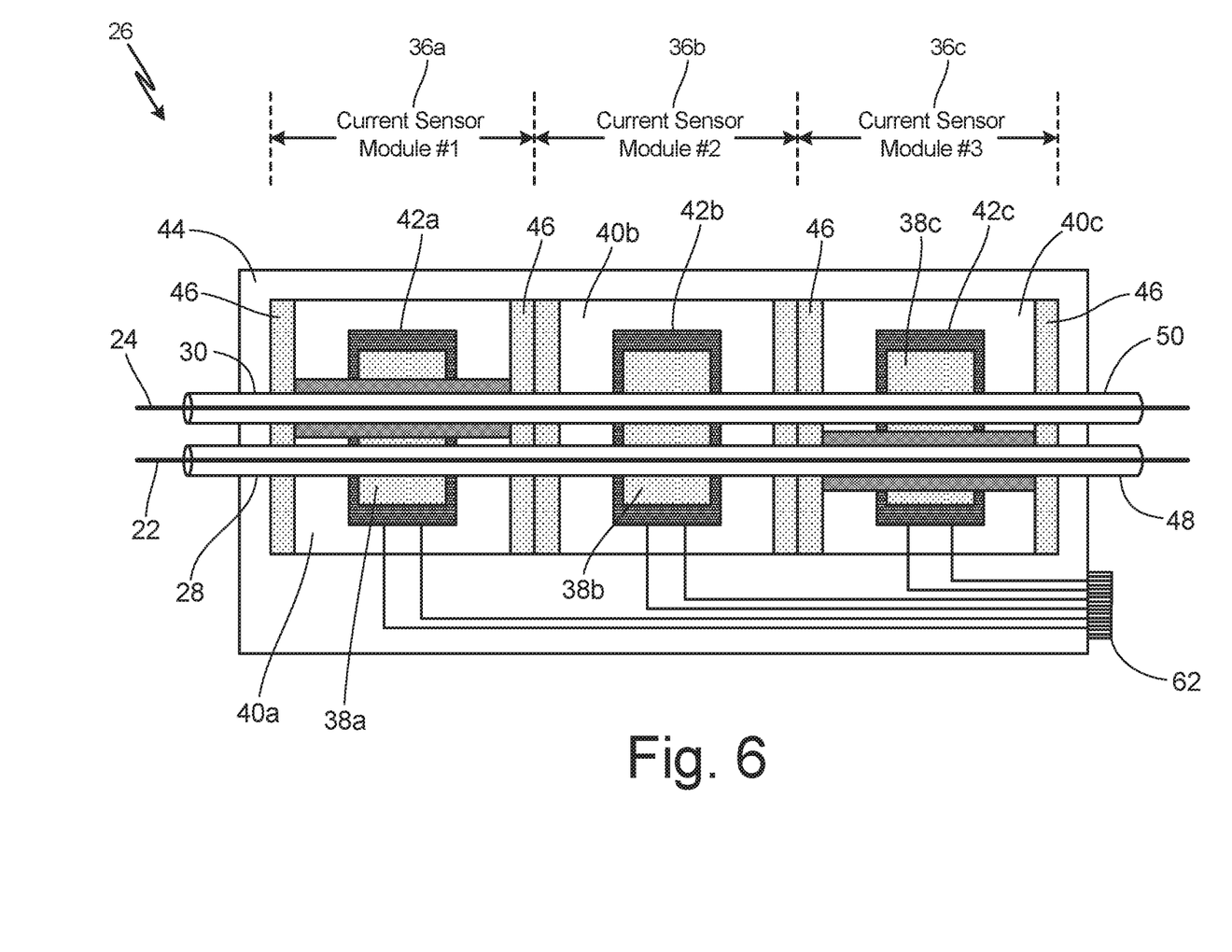
FIG. 6 is a schematic diagram of another embodiment of the current sensor assembly.

FIG. 6 is a cross-sectional view of another embodiment of current sensor assembly 26. As shown in FIG. 6, current sensor assembly 26 can include a wired communication interface 62 in place of wireless communication interface 58 and wireless antenna 32 shown in the embodiment of FIG. 2. Wired communication interface 62 can be a ARINC 429, CAN, RS422/232, Ethernet, AFDX, or any other wired communication interface that allows signals or data to be communicated from current sensor assembly 26 to control and interface circuit 14 and/or avionics 18. All other elements of current sensor assembly 26 shown in FIG. 6 are similarly arranged and configured as described above with reference to FIG. 2.

Discussion of Possible Embodiments

In one embodiment, a sensor assembly for monitoring a heater system for an aircraft probe sensor includes a first current sensor module and a second current sensor module. The first current sensor module includes a first current sensor core and a first high electromagnetically permeable enclosure around the first current sensor core. A first input wire pathway extends through the first current sensor core and the first high electromagnetically permeable enclosure and is configured to receive a heater input wire. A first return wire pathway extends through the first current sensor core and the first high electromagnetically permeable enclosure and is configured to receive a heater return wire. The second current sensor module includes a second current sensor core and a second high electromagnetically permeable enclosure around the second current sensor core. A second input wire pathway extends through the second current sensor core and the second high electromagnetically permeable enclosure and is configured to receive the heater input wire. A second return wire pathway extends through the second current sensor core and the second high electromagnetically permeable enclosure and is configured to receive the heater return wire. A high electromagnetically permeable tube extends through the first current sensor core and is configured to extend around one of the heater input wire and the heater return wire.

The sensor assembly of the preceding paragraph can optionally include, additionally and/or alternatively, any one or more of the following features, configurations and/or additional components:

a third current sensor module, wherein the third current sensor module comprises: a third current sensor core; a third high electromagnetically permeable enclosure around the third current sensor core; a third input wire pathway extending through the third current sensor core and the third high electromagnetically permeable enclosure and configured to receive the heater input wire; and a third return wire pathway extending through the third current sensor core and the third high electromagnetically permeable enclosure and configured to receive the heater return wire; and a second high electromagnetically permeable tube, wherein the second high electromagnetically permeable tube extends through the second current sensor core in the second input wire pathway and is configured to receive the heater input wire through the second high electromagnetically permeable tube, and wherein the high electromagnetically permeable tube extends through the first current sensor core in the first return wire pathway and is configured to receive the heater return wire through the high electromagnetically permeable tube;

the high electromagnetically permeable tube and the second high electromagnetically permeable tube are formed from a material with a permeability of $9.42 \times 10^{-4} \mu$ (H/m) to $1.26 \times 10^{0} \mu$ (H/m) between 0.002 T to 0.5 T;

the first input wire pathway, the second input wire pathway, and the third input wire pathway are all aligned;

the first return wire pathway, the second return wire pathway, and the third return wire pathway are all aligned;

a first guide tube extending through the first return wire pathway, the second return wire pathway, and the third return wire pathway, and wherein the first guide tube is sized to receive the heater return wire; and a second guide tube extending through the first input wire pathway, the second input wire pathway, and the third input wire pathway, and wherein the second guide tube is sized to receive the heater input wire, and wherein the first guide tube extends within the high electromagnetically permeable tube, and wherein the second guide tube extends within the second high electromagnetically permeable tube;

the first guide tube and the second guide tube are flexible;

the high electromagnetically permeable tube and the second high electromagnetically permeable tube are each seamless;

the first, second, and third high electromagnetically permeable enclosures are formed from a material with a permeability of $9.42 \times 10^{-4} \mu$ (H/m) to $1.26 \times 10^{0} \mu$ (H/m) between 0.002 T to 0.5 T;

a communication interface connected to the first, second, and third current sensor modules and configured to communicate monitored current data of the heater input wire and the heater return wire to a remote data concentrator and/or a central data acquisition unit; and/or a fourth current sensor core in the current sensor module, wherein the fourth current sensor core is daisy-chained to the current sensor core, and wherein the high electromagnetically permeable tube extends through the fourth current sensor core; a fifth current sensor core in the second current sensor module, wherein the fifth current sensor core is daisy-chained to the second current sensor core, and wherein the second high electromagnetically permeable tube extends through the fifth current sensor core; and a sixth current sensor core in the third current sensor module, wherein the sixth current sensor core is daisy-chained to the third current sensor core.

In another embodiment, a sensor assembly for monitoring a heater system for an aircraft probe sensor includes a current sensor module. The current sensor module includes a current sensor core and a high electromagnetically permeable enclosure around the current sensor core. An input wire pathway extends through the current sensor core and is configured to receive a heater input wire. A return wire pathway extends through the current sensor core and is configured to receive a heater return wire. A high electromagnetically permeable tube extends through the current sensor core and is configured to extend around one of the input wire and the heater return wire.

The sensor assembly of the preceding paragraph can optionally include, additionally and/or alternatively, any one or more of the following features, configurations and/or additional components:

a second current sensor module adjacent the current sensor module, the second current sensor module comprising; a second current sensor core; and a second high electromagnetically permeable enclosure around the second current sensor core; the input wire pathway extending through the current sensor core and the second current sensor core and configured to receive the heater input wire; the return wire pathway extending through the current sensor core and the second current sensor core and configured to receive the heater return wire;

a third current sensor module adjacent the second current sensor module, wherein the third current sensor module comprises: a third current sensor core; a third high electromagnetically permeable enclosure around the third current sensor core, wherein the input wire pathway extends through the third current sensor core and the return wire pathway extends through the third current sensor core; and a second high electromagnetically permeable tube, wherein the second high electromagnetically permeable tube extends in the input wire pathway through one of the second current sensor core and the third current sensor core and is configured to extend around the heater input wire, and wherein the high electromagnetically permeable tube extends through the current sensor core in the return wire pathway and is configured to receive the heater return wire;

the high electromagnetically permeable tube, the second high electromagnetically permeable tube, the high electromagnetically permeable enclosure, the second high electromagnetically permeable enclosure, and the third high electromagnetically permeable enclosure are formed from a material with a permeability of $9.42 \times 10^{-4} \mu$ (H/m) to $1.26 \times 10^{0} \mu$ (H/m) between 0.002 T to 0.5 T;

the high electromagnetically permeable tube and the second high electromagnetically permeable tube are each seamless;

a first guide tube extending across the current sensor module, the second current sensor module, and the third current sensor module through the return wire pathway, and wherein the first guide tube is sized to receive the heater return wire; and a second guide tube extending across the current sensor module, the second current sensor module, and the third current sensor module through the input wire pathway, and wherein the second guide tube is sized to receive the heater input wire;

the first guide tube extends within the high electromagnetically permeable tube, and the second guide tube extends within the second high electromagnetically permeable tube; and/or a fourth current sensor core in the current sensor module, wherein the fourth current sensor core is daisy-chained to the current sensor core, and wherein the high electromagnetically permeable tube extends through the fourth current sensor core; a fifth current sensor core in the second current sensor module, wherein the fifth current sensor core is daisy-chained to the second current sensor core, and wherein the second high electromagnetically permeable tube extends through the fifth current sensor core; and a sixth current sensor core in the third current sensor module, wherein the sixth current sensor core is daisy-chained to the third current sensor core.

In another embodiment, a method for monitoring current in a heater system for an aircraft probe sensor includes feeding an input wire of the heater system through an input pathway across a first current sensor module and across a second current sensor module. A return wire of the heater system is fed through a return pathway across the first current sensor module and across the second current sensor module. A voltage is applied across the input wire and the return wire of the heater system. The first current sensor module is shielded from magnetic flux in the return wire with a high electromagnetically permeable tube extending around the return wire in the first current sensor module. Magnetic flux in the input wire is sensed by the first current sensor module to determine input current in the input wire. The second current sensor module is shielded from the magnetic flux in the input wire with a second high electromagnetically permeable tube extending around the input wire in the second current sensor module. The magnetic flux is sensed in the return wire by the second current sensor module to determine return current in the return wire.

The method of the preceding paragraph can optionally include, additionally and/or alternatively, any one or more of the following features, configurations and/or additional components:

feeding the input wire of the heater system through the input pathway across a third current sensor module; feeding the return wire of the heater system through the return pathway across the third current sensor module; and sensing the magnetic flux in the input wire and the return wire by the third current sensor module to determine a differential current between the input wire and the return wire; and/or blocking interference from external sources by enclosing the first current sensor module in a first high electromagnetically permeable enclosure, enclosing the second current sensor module in a second high electromagnetically permeable enclosure, and enclosing the third current sensor module in a third high electromagnetically permeable enclosure.

While the invention has been described with reference to an exemplary embodiment(s), it will be understood by those skilled in the art that various changes may be made and equivalents may be substituted for elements thereof without departing from the scope of the invention. For example, while second current sensor module 36b is positioned between first current sensor module 36a and third current sensor module 36c in the embodiment FIG. 2, third current sensor module 36c can be positioned between first current sensor module 36a and second current sensor module 36b. In other embodiments, current sensor assembly 26 can include only two of first current sensor module 36a, second current sensor module 36b, and third current sensor module 36c. In other embodiments, current sensor assembly 26 can include only one of first current sensor module 36a, second current sensor module 36b, and third current sensor module 36c. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A sensor assembly for monitoring a heater system for an aircraft probe sensor, the sensor assembly comprising;
   a first current sensor module comprising:
      a first current sensor core;
      a first high electromagnetically permeable enclosure around the first current sensor core;
      a first input wire pathway extending through the first current sensor core and the first high electromagnetically permeable enclosure and configured to receive a heater input wire; and
      a first return wire pathway extending through the first current sensor core and the first high electromagnetically permeable enclosure and configured to receive a heater return wire;
   a second current sensor module comprising;
      a second current sensor core;
      a second high electromagnetically permeable enclosure around the second current sensor core;
      a second input wire pathway extending through the second current sensor core and the second high electromagnetically permeable enclosure and configured to receive the heater input wire; and
      a second return wire pathway extending through the second current sensor core and the second high electromagnetically permeable enclosure and configured to receive the heater return wire; and
   a high electromagnetically permeable tube extending through the first current sensor core and configured to extend around one of the heater input wire and the heater return wire.

2. The sensor assembly of claim 1, further comprising a third current sensor module, wherein the third current sensor module comprises:
      a third current sensor core;
      a third high electromagnetically permeable enclosure around the third current sensor core;
      a third input wire pathway extending through the third current sensor core and the third high electromagnetically permeable enclosure and configured to receive the heater input wire; and
      a third return wire pathway extending through the third current sensor core and the third high electromagnetically permeable enclosure and configured to receive the heater return wire; and
   a second high electromagnetically permeable tube, wherein the second high electromagnetically permeable tube extends through the second current sensor core in the second input wire pathway and is configured to receive the heater input wire through the second high electromagnetically permeable tube, and
   wherein the high electromagnetically permeable tube extends through the first current sensor core in the first return wire pathway and is configured to receive the heater return wire through the high electromagnetically permeable tube.

3. The sensor assembly of claim 2, wherein the high electromagnetically permeable tube and the second high electromagnetically permeable tube are formed from a material with a permeability of $9.42 \times 10^{-4} \mu$ (H/m) to $1.26 \times 10^0 \mu$ (H/m) between 0.002 T to 0.5 T.

4. The sensor assembly of claim 3, wherein the first input wire pathway, the second input wire pathway, and the third input wire pathway are all aligned.

5. The sensor assembly of claim 4, wherein the first return wire pathway, the second return wire pathway, and the third return wire pathway are all aligned.

6. The sensor assembly of claim 2 further comprising:
   a first guide tube extending through the first return wire pathway, the second return wire pathway, and the third return wire pathway, and wherein the first guide tube is sized to receive the heater return wire; and
   a second guide tube extending through the first input wire pathway, the second input wire pathway, and the third input wire pathway, and wherein the second guide tube is sized to receive the heater input wire, and
   wherein the first guide tube extends within the high electromagnetically permeable tube, and
   wherein the second guide tube extends within the second high electromagnetically permeable tube.

7. The sensor assembly of claim 6, wherein the first guide tube and the second guide tube are flexible.

8. The sensor assembly of claim 2, wherein the high electromagnetically permeable tube and the second high electromagnetically permeable tube are each seamless.

9. The sensor assembly of claim 2, wherein the first, second, and third high electromagnetically permeable enclosures are formed from a material with a permeability of $9.42 \times 10^{-4} \mu$ (H/m) to $1.26 \times 10^0 \mu$ (H/m) between 0.002 T to 0.5 T.

10. The sensor assembly of claim 2 further comprising:
    a communication interface connected to the first, second, and third current sensor modules and configured to communicate monitored current data of the heater input wire and the heater return wire to a remote data concentrator and/or a central data acquisition unit.

11. The sensor assembly of claim 2 further comprising:
    a fourth current sensor core in the first current sensor module, wherein the fourth current sensor core is daisy-chained to the first current sensor core, and wherein the high electromagnetically permeable tube extends through the fourth current sensor core;
    a fifth current sensor core in the second current sensor module, wherein the fifth current sensor core is daisy-chained to the second current sensor core, and wherein the second high electromagnetically permeable tube extends through the fifth current sensor core; and
    a sixth current sensor core in the third current sensor module, wherein the sixth current sensor core is daisy-chained to the third current sensor core.

12. A sensor assembly for monitoring a heater system for an aircraft probe sensor, the sensor assembly comprising;
    a current sensor module comprising:
       a current sensor core; and
       a high electromagnetically permeable enclosure around the current sensor core;
    a second current sensor module adjacent the current sensor module, the second current sensor module comprising;
       a second current sensor core; and
       a second high electromagnetically permeable enclosure around the second current sensor core;
    an input wire pathway extending through the current sensor core and the second current sensor core and configured to receive a heater input wire;
    a return wire pathway extending through the current sensor core and the second current sensor core and configured to receive a heater return wire; and a high electromagnetically permeable tube extending through the current sensor core and configured to extend around one of the input wire and the heater return wire.

13. The sensor assembly of claim 12, further comprising a third current sensor module adjacent the second current sensor module, wherein the third current sensor module comprises:
a third current sensor core; and
a third high electromagnetically permeable enclosure around the third current sensor core,
wherein the input wire pathway extends through the third current sensor core and the return wire pathway extends through the third current sensor core; and
a second high electromagnetically permeable tube, wherein the second high electromagnetically permeable tube extends in the input wire pathway through one of the second current sensor core and the third current sensor core and is configured to extend around the heater input wire, and
wherein the high electromagnetically permeable tube extends through the current sensor core in the return wire pathway and is configured to receive the heater return wire.

14. The sensor assembly of claim 13, wherein the high electromagnetically permeable tube, the second high electromagnetically permeable tube, the high electromagnetically permeable enclosure, the second high electromagnetically permeable enclosure, and the third high electromagnetically permeable enclosure are formed from a material with a permeability of $9.42 \times 10^{-4} \mu$ (H/m) to $1.26 \times 10^{0} \mu$ (H/m) between 0.002 T to 0.5 T.

15. The sensor assembly of claim 13 further comprising:
a first guide tube extending across the current sensor module, the second current sensor module, and the third current sensor module through the return wire pathway, and wherein the first guide tube is sized to receive the heater return wire; and
a second guide tube extending across the current sensor module, the second current sensor module, and the third current sensor module through the input wire pathway, and wherein the second guide tube is sized to receive the heater input wire.

16. The sensor assembly of claim 15, wherein the first guide tube extends within the high electromagnetically permeable tube, and the second guide tube extends within the second high electromagnetically permeable tube.

17. A method for monitoring current in a heater system for an aircraft probe sensor, the method comprising:
feeding an input wire of the heater system through an input pathway across a first current sensor module and across a second current sensor module;
feeding a return wire of the heater system through a return pathway across the first current sensor module and across the second current sensor module;
applying a voltage across the input wire and the return wire of the heater system;
shielding the first current sensor module from magnetic flux in the return wire with a high electromagnetically permeable tube extending around the return wire in the first current sensor module;
sensing magnetic flux in the input wire by the first current sensor module to determine input current in the input wire;
shielding the second current sensor module from the magnetic flux in the input wire with a second high electromagnetically permeable tube extending around the input wire in the second current sensor module; and
sensing the magnetic flux in the return wire by the second current sensor module to determine return current in the return wire.

18. The method of claim 17, further comprising:
feeding the input wire of the heater system through the input pathway across a third current sensor module;
feeding the return wire of the heater system through the return pathway across the third current sensor module; and
sensing the magnetic flux in the input wire and the return wire by the third current sensor module to determine a differential current between the input wire and the return wire.

19. The method of claim 18, further comprising:
blocking interference from external sources by enclosing the first current sensor module in a first high electromagnetically permeable enclosure, enclosing the second current sensor module in a second high electromagnetically permeable enclosure, and enclosing the third current sensor module in a third high electromagnetically permeable enclosure.

* * * * *